United States Patent
Chen et al.

(10) Patent No.: US 9,053,277 B2
(45) Date of Patent: Jun. 9, 2015

(54) CLOCK TREE CONSTRUCTION ACROSS CLOCK DOMAINS

(71) Applicant: INTERNATIONAL BUSINESS MACHINES CORPORATION, Armonk, NY (US)

(72) Inventors: Sun Yang Chen, Shanghai (CN); Yang Liu, Shanghai (CN); Lie Zhi Wu, Shanghai (CN); Yue Xu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/225,813

(22) Filed: Mar. 26, 2014

(65) Prior Publication Data

US 2014/0298283 A1 Oct. 2, 2014

(30) Foreign Application Priority Data

Mar. 28, 2013 (CN) .......................... 2013 1 0103413

(51) Int. Cl.
*G06F 17/50* (2006.01)

(52) U.S. Cl.
CPC ........ *G06F 17/5068* (2013.01); *G06F 2217/62* (2013.01)

(58) Field of Classification Search
USPC ................................................ 716/110–116
See application file for complete search history.

(56) References Cited

U.S. PATENT DOCUMENTS

| | | | |
|---|---|---|---|
| 6,434,704 B1 * | 8/2002 | Dean et al. ..................... | 713/320 |
| 6,536,024 B1 * | 3/2003 | Hathaway ..................... | 327/295 |
| 6,782,519 B2 | 8/2004 | Chang et al. | |
| 2005/0131670 A1 * | 6/2005 | Wang et al. ..................... | 703/23 |
| 2008/0127018 A1 * | 5/2008 | Alpert et al. ..................... | 716/10 |
| 2010/0231282 A1 | 9/2010 | Singasani | |
| 2012/0023469 A1 | 1/2012 | Darsow et al. | |
| 2012/0240091 A1 | 9/2012 | Sunder et al. | |

OTHER PUBLICATIONS

Takeshi Matsui, Masatoshi Sakawa, Kosuke Kato, "Particle Swarm Optimization for Nonlinear 0-1 Programming Problems." Systems, Man and Cybernetics, 2008 . SMC 2008. IEEE International Conference on Oct. 12-15, 2008: pp. 168-173.

"An improved particle swarm optimization algorithm for solving 0-1 knapsack problem," Machine Learning and Cybernetics, 2008 International Conference on Jul. 12-15, 2008: p. 915-918.

Dimitrios Velenis,Marios Papefthymiou, Eby Friedman, "Physical Design for Reduced Delay Uncertainty in High Performance Clock Distribution Networks." Conference on Design, Automation and Test in Europe, vol. 1; Mar. 3-7, 2003:pp. 531-534.

* cited by examiner

*Primary Examiner* — Binh Tat
(74) *Attorney, Agent, or Firm* — Anthony J. Canale

(57) ABSTRACT

Disclosed is a method and system for clock tree construction across clock domains, an integrated circuit and fabrication method thereof. A method for clock tree construction includes acquiring a netlist describing an integrated circuit (IC), comprising data for describing physical locations and logic connections of clock sinks belonging to multiple clock domains on the pattern of the IC, and constructing the clock tree across clock domains based on the netlist, such that clock cells belonging to different clock domains can share more physical locations. Accordingly, clock trees can be constructed across clock domains to improve IC performance.

17 Claims, 9 Drawing Sheets

CLOCK TREE CONSTRUCTION ACROSS CLOCK DOMAINS

BACKGROUND

The present invention relates to integrated circuit (IC) design, and more specifically, to a method and system for clock tree construction, an IC and a fabrication method thereof.

A typical IC may comprise a large amount of logic elements and other circuits for implementing IC logic functionality. Further, an IC chip may comprise a clock tree (i.e., a clock signal distribution network) for distributing a clock signal received at an input to all clock sinks that are "clocked" by the clock signal. A clock tree may comprise wires, buffers etc, to distribute the "clock signal" that controls the timing and operation of logical elements and other circuits of the IC. Clock sinks (or sinks) refer to logic elements or other circuits such as registers (flip-flops), RAM and latches, controlled by a clock signal, such that they add capacitance to the clock tree. Those sinks can change their states in response to clock signal pulses, and the IC synchronizes state changes in various sinks in a clock domain by clocking them with the same clock signal.

Clock skew is a significant aspect in assessing clock tree performance and quality. Clock skew generally refers to the difference (delay) between arrival times at any two clock sinks of a clock signal from an external clock source. Due to different path lengths of various branches to the respective clock sinks in a clock tree, there may be some clock skews between those various clock sinks. Further, in order to deliver the clock signal to every region of an IC, clock cells (buffers, for example) are generally inserted in the clock tree to amplify and/or retransmit the clock signal. However, because each clock cell has an intrinsic delay, it may cause a certain clock skew also. Thus, controlling or restricting the level number of buffers in a clock tree is one way for improving clock tree performance and IC design quality. Theoretically, smaller clock skews can be obtained, if there are less but the same levels of buffers contained in each branch leading to various clock sinks in a clock tree. However, the above assumption cannot be satisfied in practical IC design in many situations. With the technical evolution of digital IC design, a common path method is becoming more important for improving clock tree's skew and timing. A common path generally refers to a path consisted of buffers that are shared by multiple sinks in a clock tree. The longer the common path is, the smaller the clock skew of a clock signal arriving at sinks is. Traditional techniques employ a method to maximize the common path, that is, to allow sinks in a clock tree to share buffers at various levels as much as possible. In principle, the more buffers shared in a clock tree, the longer the common path will be. As a result, the performance of the clock tree may be optimized, and the quality of the IC designed may be improved. Other means for clock tree optimization include, for example, utilizing high performance clock cells (elements) capable of reducing clock skew, and the like.

SUMMARY

The above clock tree optimization schemes are directed to clock tree optimization in the same clock domain. However, in practical applications, different units or modules in an IC may require different clock frequencies, phases, and waveforms in many situations, and thereby will operate in different clock domains. There are many data communications across clock domains. In such a case, having completely different clock sources, there is no common path at all between different clock domains from logic view. The traditional means of common path maximization in a single clock domain does not take such a condition into consideration, and thus cannot address the problem of clock tree optimization across clock domains.

Therefore, there is a significant requirement in IC logic design for clock tree optimization across clock domains. According to an embodiment of the present invention, there is provided a method for clock tree construction, comprising the following steps: acquiring a netlist describing an integrated circuit (IC), wherein the netlist comprises data for describing physical locations and logic connections of clock sinks belonging to multiple clock domains on the pattern of the IC; and constructing a clock tree across clock domains based on the netlist such that clock cells belonging to different clock domains can share more physical locations.

According to another embodiment of the present invention, there is provided a system for clock tree construction, comprising: an acquisition module, configured to acquire a netlist describing an integrated circuit (IC), wherein the netlist comprises data for describing physical locations and logic connections of clock sinks belonging to multiple clock domains on the pattern of the IC; and a construction module, configured to construct a clock tree across clock domains based on the netlist such that clock cells belonging to different clock domains can share more physical locations.

According to another embodiment of the present invention, there is provided a method for integrated circuit (IC) fabrication, in which clock trees are constructed for the IC by using the method of clock tree construction of the above embodiment. In turn, based on the netlist and the constructed clock trees, subsequent IC design and fabrication processes are performed with tools and methods that are commonly used in the art.

According to the aspects of the present invention, it is possible to construct clock trees across clock domains, so that IC performance can be improved.

BRIEF DESCRIPTION OF THE SEVERAL VIEWS OF THE DRAWINGS

Through the more detailed description of some embodiments of the present invention in the accompanying drawings, the above and other objects, features and advantages of the present invention will become more apparent, wherein the same reference generally refers to the same components in embodiments of the present invention.

DETAILED DESCRIPTION

Figure 1:
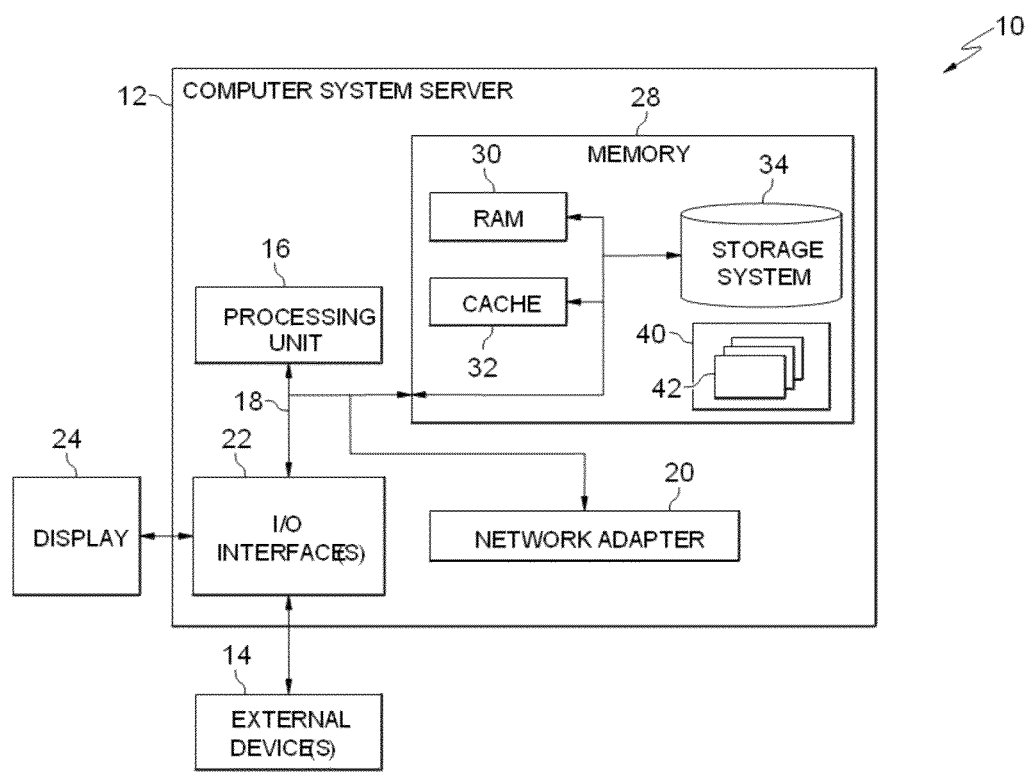
FIG. 1 shows an exemplary computer system/server 12 which is applicable to implement embodiments of the present invention.

Embodiments of the present invention will be described in more detail with reference to the accompanying drawings. The present invention can be implemented in various manners, and thus should not be construed to be limited to the embodiments disclosed herein. Those embodiments provide an understanding of the present invention to those skilled in the art.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, in which an exemplary computer system/server 12 which is applicable to implement embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

As mentioned above, clock tree optimization schemes in the traditional techniques are directed to clock tree optimization in the same clock domain, which cannot address the problem of clock tree optimization across clock domains. Therefore, it has been recognized that there is a significant requirement in IC logic designs for clock tree optimization across clock domains.

As will be appreciated by those skilled in the art, there are many variations (such as, process, temperature, voltage) that may influence timing correlations between IC cells. The clock skew of a cell may comprise an intrinsic latency of the cell and process variations, which may further comprise system variations and random variations. Wherein the intrinsic latency is considered as a sample error having a normal distribution, and is uncontrollable theoretically. The process variations, especially the system variations, are related to IC fabrication processes, which can be reduced or eliminated through optimization in IC design.

In view of this, it is contemplated to reduce clock skew through placing clock cells belonging to different clock domains physically close to each other, even though it is impossible to merge clock trees of different logic clock domains. That is to say, sharing physical locations between different clock trees may act as a means for reducing variations (especially, system variations).

It is intended to provide a scheme to make clock trees of various clock domains to physically overlap with each other to a greater extent, preferably, as much as possible. In the case of physically overlapping the clock trees of various clock domains as much as possible, components of clock cells in multiple clock domains may operate in nearly the same conditions (for example, process, temperature, voltage), which may be helpful to reduce clock latency variations between clock domains.

Figure 2:
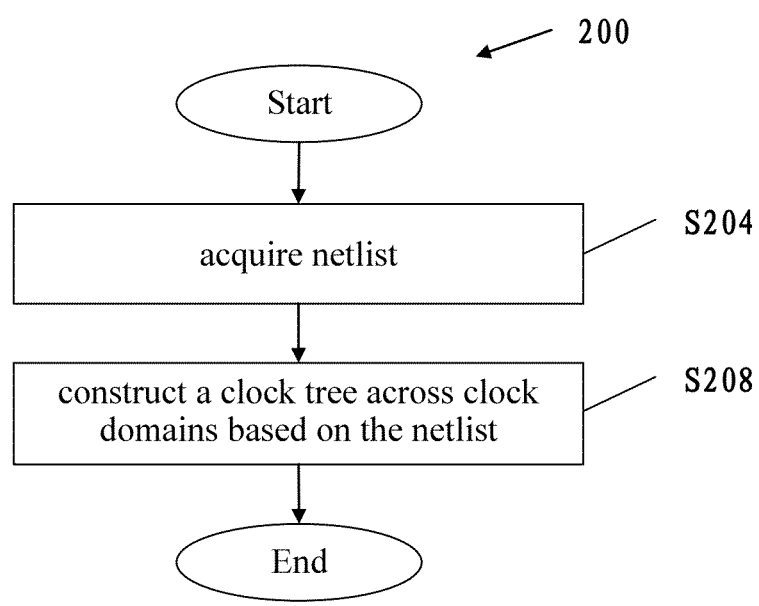
FIG. 2 shows a flowchart of a method for clock tree construction according to an embodiment of the present invention.

Referring to FIG. 2 which shows a schematic flowchart of a method 200 for clock tree construction according to an embodiment of the present invention.

As shown in FIG. 2, method 200 starts at step S204. At step S204, a netlist for describing an integrated circuit (IC) is acquired. In the design of an IC, a netlist is generated, and such a process is generally referred to as netlist placement. Netlist placement generally assigns logic elements and other circuits to physical locations on an IC pattern. In general, the netlist generated from netlist placement does not comprise connections between these elements and circuits. These elements and circuits comprise clock sinks (or sinks), i.e., logic elements and other circuits that are controlled by clock signals in the IC, such as registers (flip-flops), RAM and latches. Hence, the netlist comprises the description of physical locations and logical connections of logic elements and other circuits in the IC. In practice, these clock sinks generally belong to different clock domains. Thus, data describing physical locations and logical connections of clock sinks belonging to multiple clock domains on the IC pattern is acquired at step S204.

Next, at step S208, based on the data describing physical locations and logical connections of clock sinks belonging to multiple clock domains on the IC pattern acquired at step S204, clock trees across clock domains are constructed to enable clock cells of different clock domains to share more physical locations. That is, as compared to clock trees of various clock domains derived without using the scheme of the present invention, clock cells belonging to different clock domains of clock trees constructed using the scheme of the present invention may share more physical locations. Preferably, when constructing clock trees across clock domains at step S208, clock cells belonging to different clock domains are enabled to share physical locations as much as possible. As mentioned above, a significant requirement in IC design for clock tree optimization across clock domains has been recognized. Thus, a means is contemplated and proposed to establish clock trees across clock domains to enable clock cells belonging different clock domains to share more (preferably, as many as possible) physical locations. Therefore, clock skews between different clock domains of the constructed clock tree can be reduced or eliminated.

Figure 3:
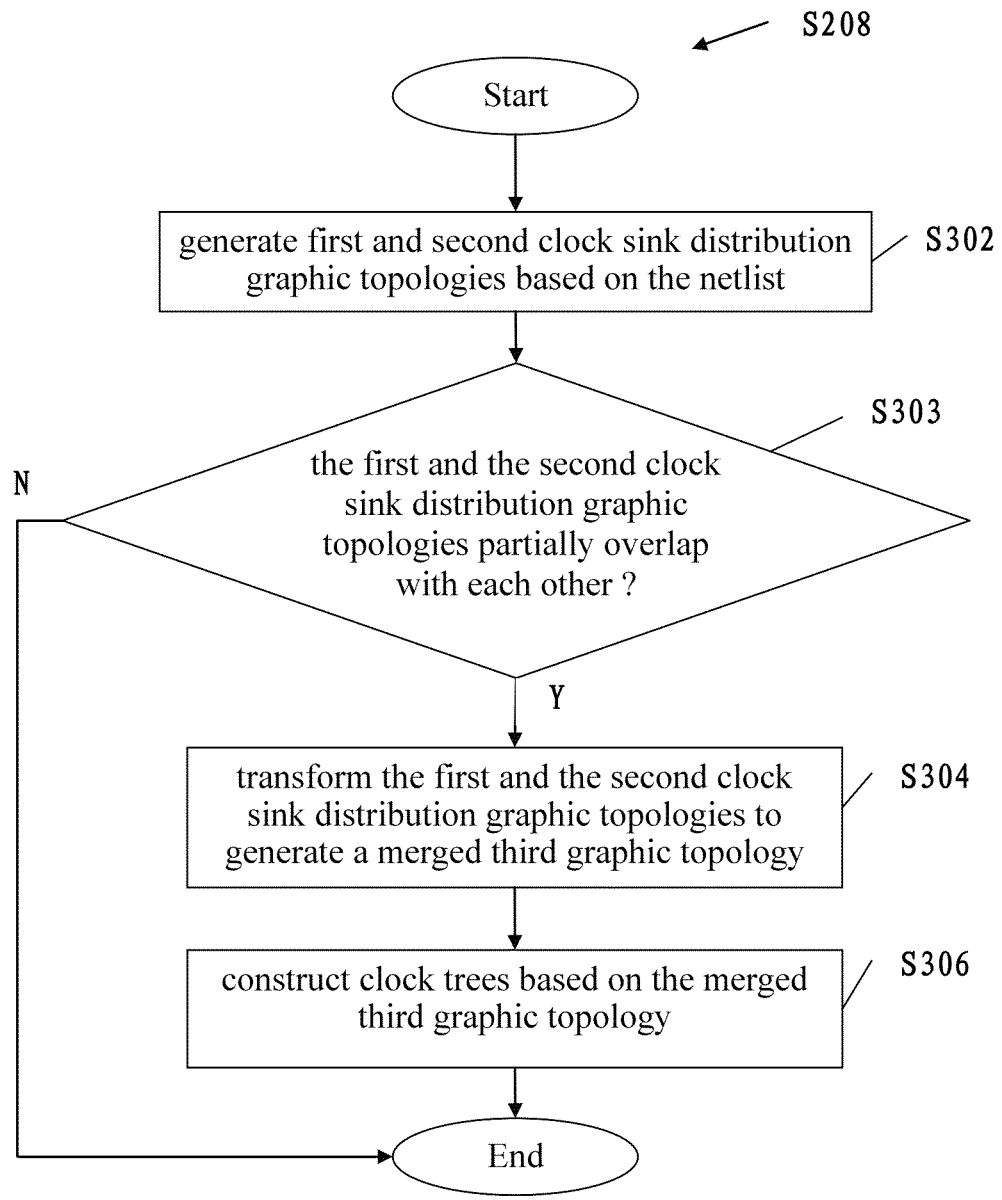
FIG. 3 shows a flowchart of an exemplary embodiment of a process in the method for clock tree construction according to an embodiment of the present invention.

As an example, FIG. 3 shows a flowchart of an exemplary embodiment of the clock tree establishment process (S208) in method 200 for clock tree construction shown in FIG. 2. Herein, a description is given with an example, in which clock trees are constructed across two clock domains. Those skilled in the art may understand that it is also possible to establish clock trees across more than two clock domains in a similar manner.

Figure 6:
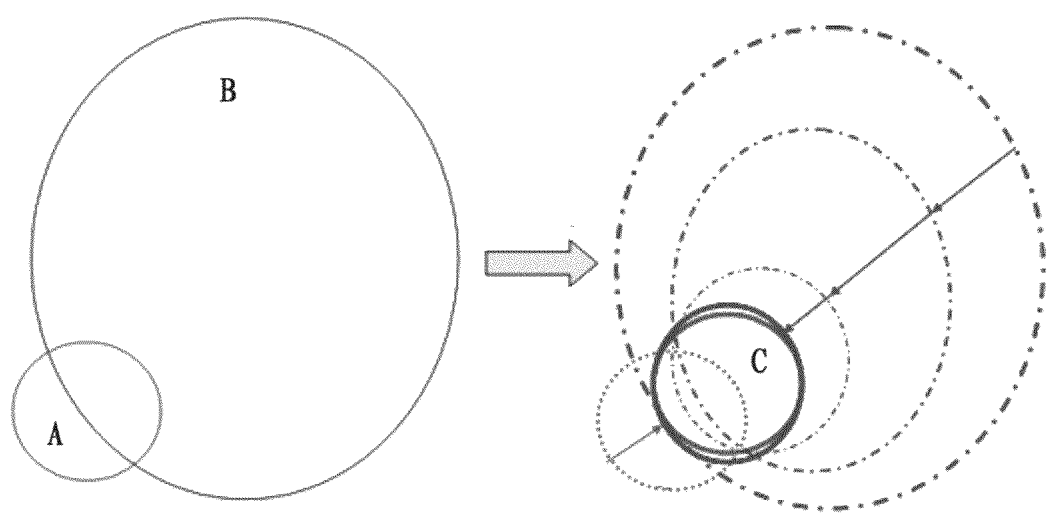
FIG. 6 shows a flowchart of an exemplary embodiment of a process in the method for clock tree construction according to an embodiment of the present invention.

At first, at step S302, a first clock sink distribution graphic topology of a first clock domain (also called as clock domain A), and a second clock sink distribution graphic topology of a second clock domain (also called as clock domain B) are generated based on the netlist. As mentioned above, the netlist comprises data describing physical locations and logical connections of clock sinks belonging to multiple clock domains on the IC pattern. With the data, extracted from the netlist, of physical locations of clock sinks belonging to clock domain A and clock domain B respectively, a distribution graphic topology of clock sinks belonging to clock domain A (graphic A) and a distribution graphic topology of clock sinks belonging to clock domain B (graphic B) can be constructed. Reference can be made to FIG. 6 which will be further described below for the examples of graphs A and B. The above process of generating graphs A and B can be accomplished with Clock Tree Synthesis (CTS) tools known in the art.

Next, optionally, at step S303, it is determined whether graphs A and B overlap at least partially with each other. As mentioned above, the concept of an embodiment of the present invention comprises enabling clock cells belonging to different clock domains to share more (preferably, as many as possible) physical locations. To this purpose, the practice of an embodiment of the present invention is not considered as preferable when graphs A and B do not overlap at all. Accordingly, if it is determined at step S303 that graphs A and B do not overlap at all, the process of building clock trees across clock domains ends. Note that although a scheme containing step S303 is described herein as an example, in practice however, no matter whether or not graphs A and B overlap with each other, a merged graph C can be generated through transforming graphs A and B, as described below. Hence, step S303 is optional, and can be omitted in alternative schemes of the present invention.

If it is determined at step S303 that the generated graphs A and B overlap with each other, the process proceeds to step S304. At step S304, a merged third graphic topology (also called as graph C) is generated through transforming at least one of graphs A and B. That is, through the transformation, the first clock sink distribution graphic topology of the first clock domain and the second clock sink distribution graphic topology of the second clock domain are merged into a single graphic topology. Then, clock trees can be constructed across clock domains A and B just like for the same clock domain in subsequent processes.

The question of generating a merged graph C to build clock trees across clock domains is turned into the same clock domain question, and most CTS tools support clock tree synthesis in the same clock domain. Further, clock tree performance derating in the same clock domain can be avoided or reduced. As an example, graph B physically overlaps on graph A, and the distribution of graph B is about 10 times of that of graph A. Assuming that a clock tree is constructed for each of clock domains A and B separately, there will be four levels for clock domain A's clock tree and ten levels for clock domain B's clock tree. Rather than generating a merged graph C as that in an embodiment of the present invention, both the clock tree of clock domain A and the clock tree of clock domain B may have 10 levels when they are constructed for clock domains A and B all together, making clock domain A's clock tree latency increase dramatically. By contrast, through generating a merged graph C according to an embodiment of the present invention to generate clock trees for clock domains A and B just like for the same domain, it is possible to build a clock tree with 4 levels for clock domain A and a clock tree with 10 levels for clock domain B. That is, according to the scheme of an embodiment of the present invention, overall clock tree performance can be improved.

In general, graph transform can be performed in three manners. The first manner is to cluster a current graph toward a specific direction through clustering and biasing; the second manner is to cluster a current graph toward its center through clustering; and the third manner is to move a current graph toward a specific direction through biasing. For instance, as described further below, any of the above three manners can be realized through inserting clock cells, such as buffers, in graph A and graph B. A merged graph C is generated through limited iterations of at least one of the above manners.

FIG. 6 shows a schematic diagram illustrating a process for generating graph C through transforming graph A and graph B. In general, in order to generate a merged third graph topology, one of the first clock sink distribution graphic topology and the second clock sink distribution graphic topology having a larger bounding area is selected for transform. In the illustrative example shown in FIG. 6, graph B and graph A partially overlap with each other, and graph B has a larger bounding area than graph A. Clustering and biasing are performed on graph B to cluster it toward graph A. In addition, graph A is biased to cluster it toward graph B. The above transform is shown by dashed lines and arrows in this figure. Finally, through limited iterations, a merged graph C is generated.

Next, at step S306, clock trees are constructed based on the merged third graph topology (graph C). That is, clock trees of clock domains A and B are constructed just like constructing a clock tree for the same clock domain, to enable clock cells belonging to clock domain A and clock cells belonging to clock domain B to share more (preferably, as many as possible) physical positions.

Figure 4:
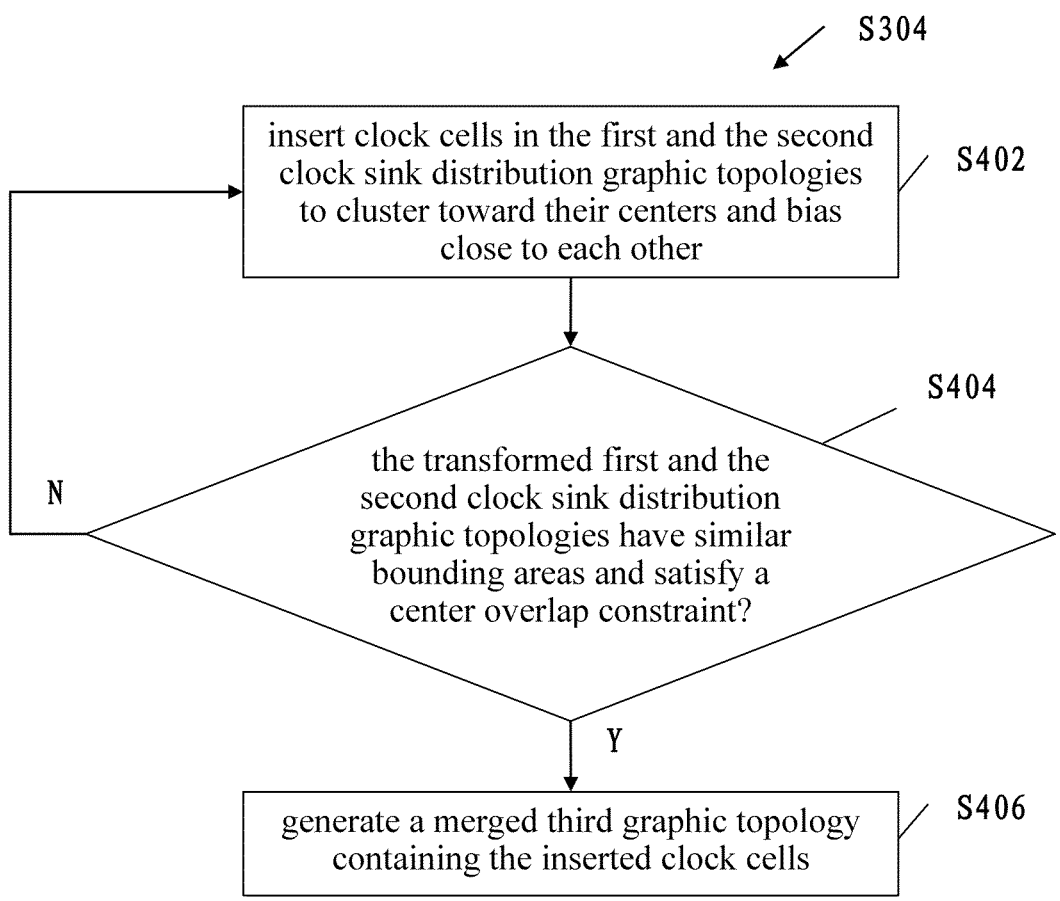
FIG. 4 shows a flowchart of an exemplary embodiment of a process in the method for clock tree construction according to an embodiment of the present invention.

FIG. 4 shows a flowchart of an exemplary embodiment of the process (S304) for generating a merged third graphic topology in the clock tree construction method according to the embodiment shown in FIG. 3.

As shown in FIG. 4, at least one first level clock cell, such as a buffer, is inserted in the first clock sink distribution graphic topology (for example, graph A) and the second clock sink distribution graphic topology (for example, graph B) to transform the first clock sink distribution graphic topology and the second clock sink distribution graphic topology. The buffer is used to drive multiple clock sinks. The inserted first level clock cell substitutes for the corresponding clock sinks it drives as a node in at least one of the first clock sink distribution graphic topology and the second clock sink distribution graphic topology, to make at least one of the first clock sink distribution graphic topology and the second clock sink distribution graphic topology to perform at least one of the action of clustering towards its center and the action of biasing the first clock sink distribution graphic topology and the second clock sink distribution graphic topology close to each other. That is, through inserting clock cells such as buffers, at least one of the three manners of transforming a clock sink distribution graphic topology (clustering and biasing, biasing, clustering) as described above is performed.

Then, at step S404, it is determined whether the transformed first and second clock sink distribution graphic topologies have similar bounding areas, and satisfy a center overlap condition. For example, the overlap condition may be a bias between the centers of the transformed first and second clock sink distribution graphic topologies that is less than a predetermined threshold. As appreciated by those skilled in the art, the threshold can be set and adjusted according to specific situations to optimize clock tree and IC performance. If the result of the determination at step S404 is Yes, the process proceeds to step S406. If the result of the determination as step S406 is No, it returns to step S402 to continue the transform process, until the transformed first and second clock sink distribution graphic topologies have similar bounding areas and satisfy the center overlap condition.

Then, at step S406, a merged third graphic topology containing the inserted clock cells is generated. Particularly, a merged third graphic topology is generated, which contains the at least one inserted first level clock cell as a node.

Note that, in the context of this document, the term "node" refers to any component in a clock tree along a path from a clock source to a clock sink. Thus, the nodes comprise clock cells that are inserted in the process of generating the third graphic topology, a process of clustering the third graphic topology, and a process of constructing clock trees based on the clustered third graphic topology, as described below.

In other words, the bounding area of the merged third graphic topology (e.g., graph C) generated according to an embodiment of the present invention comprises the at least one first level clock cell, as a node, that is inserted in the first clock sink distribution graphic topology (for example, graph A) and the second clock sink distribution graphic topology (for example, graph B). In the case that not all clock sinks are driven by the inserted clock cells, nodes forming graph C may also comprise clock sinks from graph A and/or graph B, for which no driving clock cells are inserted.

Further, according to an embodiment of the present invention, the transformation can be performed by assigning different priorities for different clock sink distribution graphic topologies to be merged according to their corresponding clock domain performance requirements, so that a clock sink distribution graphic topology having a higher priority may have a smaller bias during the transform process. Note that different clock domains may have different clock tree quality requirements, for example, different operation frequencies. Biasing a graph from its center will always introduce clock tree latency. Therefore, it is preferred to bias a clock domain distribution graphic topology having a higher operation frequency as less as possible. When merging graphs, different clock domains may be assigned with different priorities. For example, assuming that clock domain A's operation frequency is 1 GHz and clock domain B's operation frequency is 100 MHz. Since clock domain A has a higher performance requirement than clock domain B, graph A in clock domain A should be biased less than graph B in clock domain B. Thereby graph A in clock domain A may be assigned with a priority higher than that of graph B in clock domain B. If the priority of clock domain A is set to "1", the priority of clock domain B may be set to "4", indicating graph B in clock domain B has been biased 4 times already as it is necessary to bias graph A in clock domain A.

For example, when merging graphs, the following three vectors can be used:

1) p_all="A A A A B"
2) p_a="A A A A"
3) p_b="0 0 0 B"

Wherein, p_a, p_b, and p_all represent priorities of clock domain A, clock domain B, and domains A and B as a whole respectively.

Figure 5:
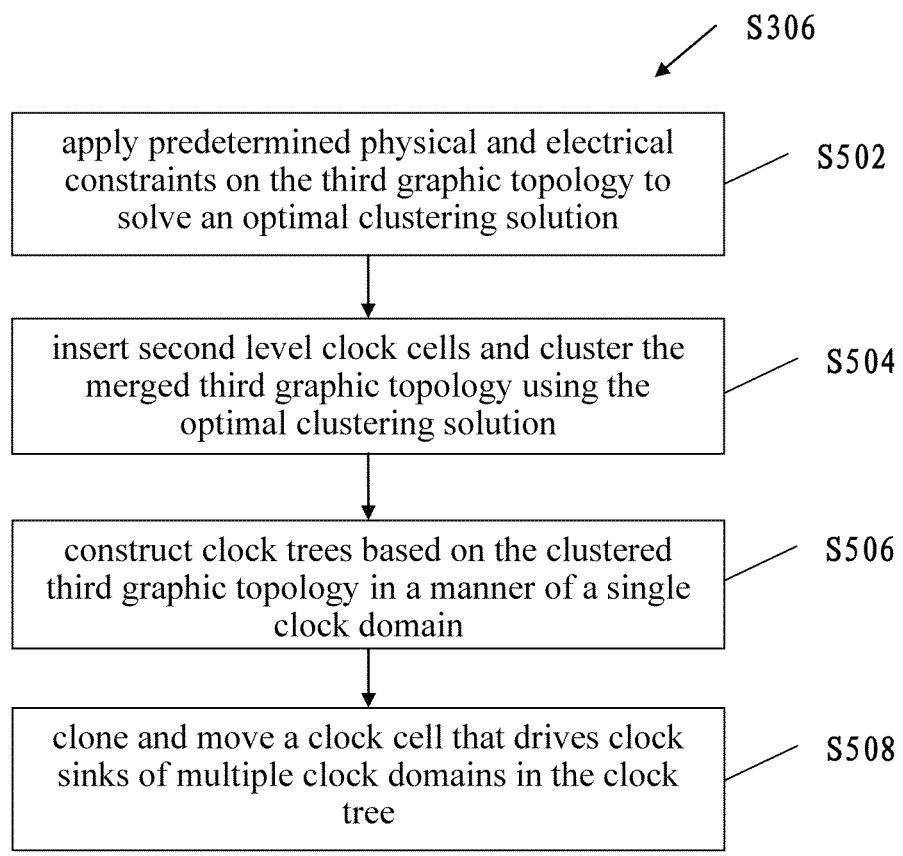
FIG. 5 shows a flowchart of an exemplary embodiment of a process in the method for clock tree construction according to an embodiment of the present invention.

Next, an embodiment of constructing clock trees based on the merged third graphic topology will be described. FIG. 5 shows a flowchart of an exemplary embodiment of a process (S306) shown in FIG. 3 for constructing clock trees based on the merged third graphic topology.

As shown in FIG. 5, at step S502, an optimal clustering solution is obtained through applying predetermined physical and electrical constraints on the third graphic topology (e.g., graph C). Particularly, predetermined physical and electrical constraints are applied on the merged third graphic topology to obtain an optimal solution that indicates nodes having the most communications between clock sinks driven by those nodes respectively should be clustered, so as to maximize a common physical path. For example, the optimal clustering solution can be obtained through solving an objective function MaxF of the following equation (1):

$$\text{Max}F = \left( \sum_{i=1}^{n} \sum_{j=1}^{n} RM(i, j) * CL(i, j) \right) \quad (1)$$

Wherein, it is assumed that the generated graph C has n nodes, which may belong to different clock domains (such as, clock domain A and clock domain B). In this embodiment, graph C is treated as a single clock domain, and logical relationships between those nodes (communication numbers) are used as a first priority when clustering the nodes of graph C. Logical relationships between nodes can be represented by a RM matrix.

Assume that any two different nodes of graph C are represented by i and j, node i has x sinks, and node j has y sinks, if there is not any logical connection (i.e., no communication) between the x sinks contained in node i and the y sinks contained in node j, RM(i,j)=0. Otherwise, it takes a value larger than 1. Obviously, the maximum value of RM (i,j) is x*y, that is, each of the x sinks contained in node i has a logical connection to each of the y sinks contained in node j. RM(i,j) implies the priority of putting nodes i and j into the same cluster. Obviously, the larger RM(i,j) is, the higher priority of putting nodes i and j into the same cluster is, because it is advantageous from the view of reducing clock latency and elongating the common path. Table 1 below shows an example of the RM matrix. Note that Table 1 is merely given to help the understanding of the RM matrix, but not a practical instance of logical connections, and by no means, a limitation of the present invention.

TABLE 1

| | i | | | | | |
|---|---|---|---|---|---|---|
| j | 0 | 1 | 2 | ... | n-1 | n |
| 0 | 1 | 2 | 11 | ... | 7 | 6 |
| 1 | 2 | 1 | 9 | ... | 3 | 7 |
| 2 | 11 | 9 | 1 | ... | 2 | 10 |
| ... | ... | ... | ... | ... | ... | ... |
| n-1 | 7 | 3 | 2 | ... | 1 | 0 |
| N | 6 | 7 | 10 | ... | 0 | 1 |

Once the RM matrix is obtained, the objective function MaxF in equation (1) to be solved can be constructed. The optimal clustering solution corresponds to the optimization result of the objective function. The clustering solution may be stored in a matrix CL, representing whether nodes i and j are clustered together. CL(i,i)=1 represents nodes i and j should be clustered together, and CL(i,i)=0 represents nodes i and j should not be clustered together. That is, the matrix CL to be solve is a solution that maximizes the value of the objective function.

In addition to the above logical relationship constraints, there are also other constraints on the clustering solution. For example, one node always can be clustered with itself, so that CL(i,i)=1 is always true. Another constraint is that all clusters should not have any intersection with each other (cluster exclusion principle), which means node i of Graphic C should only belong to one cluster. In other word, if node i and node j are clustered together, the cluster solution for node i with any other node k other than nodes i and j should be exactly the same with the cluster solution for node j with node k, as represented by equation (2) below.

$$CL(i,j)*CL(i,k)-CL(j,i)*CL(j,k)=0 \quad (2)$$

The matrix CL is symmetrical matrix since if node i can be clustered with j, then j can be clustered with i definitely, as represented by equation (3) below.

$$CL(i,j)=CL(j,i) \quad (3)$$

Besides the constraints on the CL matrix itself, according to an embodiment of the present invention, additional electrical constraints may be applied for the cluster solution also. In principle, too many nodes can't be clustered into one cluster because the total pin capacitance will be excessive. Thus, a PL vector is generated to represent a constraint on the number of nodes that can be clustered together. The PL vector has elements for storing pin capacitances of n nodes belonging to Graphic C. A maximum total pin capacitance PLMax may be defined for one cluster according to common IC design techniques. As shown in equation (4) below, PLMax is a scalar for preventing excessive pin capacitance of a cluster.

$$\sum_{j=1}^{n}(CL(i,j)*PL(j)) \leq PLMax \quad (4)$$

On the other hand, it is unreasonable to put nodes with a long distance therebetween into one cluster because net capacitance is a problem. Thus, whether two node i and node j can be clustered into the same cluster may be checked according to their physical distance, and the result may be stored into a matrix DIS, representing a distance constraint on nodes that can be clustered into the same one cluster. If it is determined that clustering nodes i, j into the same cluster does not violate the net capacitance constraint (defined by the distance between nodes i and j), DIS (i,j)=1, otherwise DIS (i,j)=0. The net capacitance constraint may be defined according to those techniques commonly used in IC design. Therefore, the following equation (5) can be derived.

$$CL(i,j) \leq DIS(i,j) \quad (5)$$

Combining the logical relationship constraint and the other physical and electrical constraints, an objective function and constraint functions can be obtained for the optimal clustering solution at step S502 as shown in equation (6) below. An optimal matrix CL that maximizes MaxF can be obtained through solving the objective function and the constraint functions. In this embodiment, the optimal matrix CL may correspond to an optimal clustering solution.

$$MaxF = \left(\sum_{i=1}^{n}\sum_{j=1}^{n}(RM(i,j)*CL(i,j))\right) \quad (6)$$

$$\begin{cases} CL(i,j)*CL(i,k)-CL(j,i)*CL(j,k)=0 \\ CL(i,j)=CL(j,i) \\ CL(i,j) \leq DIS(i,j) \\ \sum_{j=1}^{n}(CL(i,j)*PL(j)) \leq PLMax \\ CL(i,j) \in \{0,1\} \\ CL(i,i)=1 \\ i,j,k=1,2,\ldots n \end{cases}$$

Those skilled in the art may understand that equation (6) is a typical non-linear 0-1 programming problem, which can be solved through using many algorithms, such as the implicit enumeration method, the Hungarian method, the particle swarm optimization (PSO) method and the like. It has been observed that the PSO method has been proven to be more appropriate. Since how to solve a non-linear 0-1 programming problem is not the subject of the present invention, and is well known by those skilled in the art, and thus will not be described in detail herein.

Once an optimal matrix CL of the clustering solution is obtained at step S502, at step S504, the merged third graphic topology is clustered following the optimal clustering solution. Particularly, through inserting at least one second level clock cell (such as, a buffer) in the merged third graphic topology to drive two or more respective nodes to be clustered based on the solved optimal clustering solution, clustering is performed on the merged third graphic topology to obtain a clustered third graphic topology. The inserted second level clock cell substitutes for the two or more respective nodes to be clustered, as a node, in the clustered third graphic topology.

Then, at step S506, clock trees are constructed based on the clustered third graphic topology as in a single clock domain. This process may be performed with CTS tools commonly used in the art. In general, this process is performed in a top down flow along the clock tree (the clock signal transmission direction from a clock source to various nodes) and stop at the clustered graph C. Although the clustered graph C contains nodes from two clock domains (clock domain A and clock domain B), clock trees can be constructed as in the single clock domain according to an embodiment of the present invention, wherein clock cells (such as buffers) are generally inserted in the process to transmit a clock signal to all nodes.

Then, at step S508, clock cells that drive clock sinks of multiple clock domains in the clock trees are cloned and moved. Particularly, clock cells that drive clock sinks of multiple clock domains in the clock trees are cloned and the cloned clock cells are moved to a location near to those original clock cells, so that one clock cell only drives nodes of a corresponding clock domain.

Besides, according to an embodiment of the present invention, the method of constructing clock trees across clock domains may further comprise a wiring process (not shown). The wiring process may be performed with techniques known in the art. For example, those inserted and cloned clock cells in the previous process (generating a merged graph C, clustering graph C based on an optimal clustering solution, constructing clock trees as in the same clock domain based on the clustered third graph topology, cloning clock cells belonging to different clock domains) may be connected with wires to construct respective clock trees corresponding to different clock domains.

Figure 7:
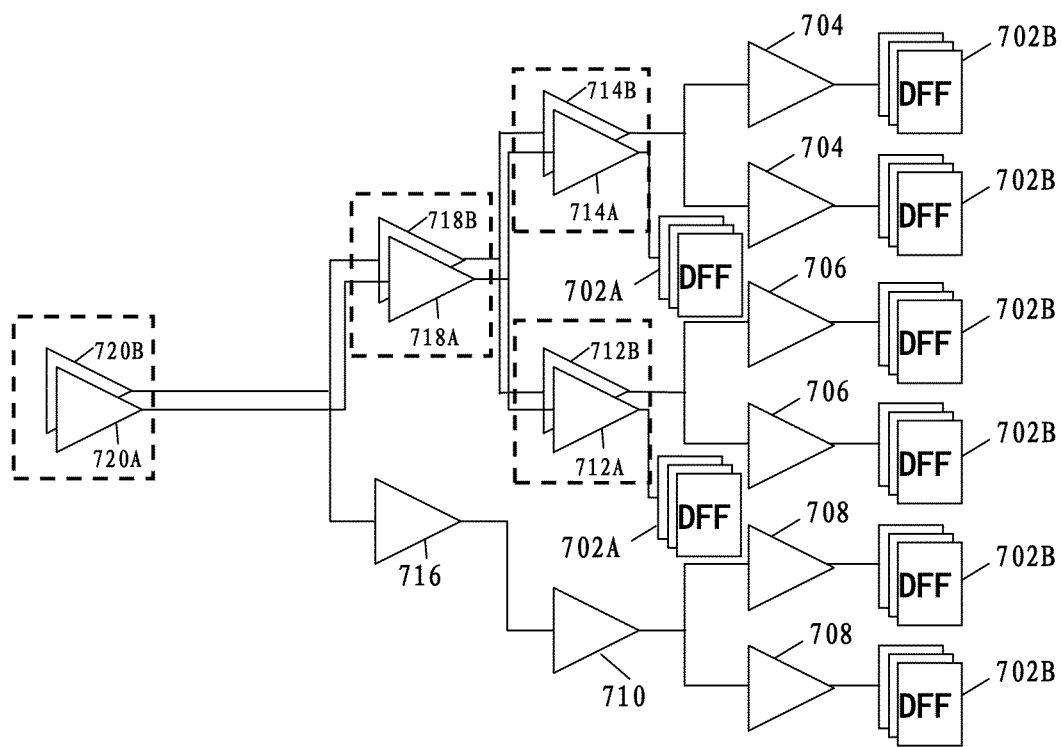
FIG. 7 shows a flowchart of an exemplary embodiment of clock trees constructed according to an embodiment of the present invention.

FIG. 7 shows a schematic diagram illustrating an example of clock trees constructed according an embodiment of the present invention. Note that FIG. 7 is merely used to help the understanding of how to construct clock trees according to an embodiment of the present invention, but not a practical clock tree instance, and by no means, a limitation of the present invention.

As shown in FIG. 7, a clock tree constructed according to an embodiment of the present invention comprises clock cells that are inserted and cloned in the processes of generating a merged graph C, clustering graph C based on an optimal clustering solution, constructing clock trees as in the single clock domain based on the clustered third graph topology, cloning clock cells belonging to different clock domains. Herein, merely clock trees that are constructed through transforming clock domain B to generate graph C are shown as an example. Wherein, reference label 702B represents multiple clock sinks belonging to clock domain B (such as registers (DFF), latches, RAM, and the like). Reference labels 704, 706 and 708 represent first level clock cells such as buffers that are inserted to drive multiple clock sinks of clock domain B in the process (S304) of generating the merged graph C respectively. The insertion is performed in a bottom up flow along the clock tree.

Reference label 702A represents multiple clock sinks of clock domain A. Reference label 714B represents second level clock cells (set 1) that are inserted in the process (S504) of clustering graph C based on an optimal clustering solution for driving first level clock cells 704 acting as nodes and a portion of the multiple clock sinks 702A of clock domain A. Similarly, reference label 712B represents second level clock cells (set 2) such as buffers that are inserted in the process (S504) of clustering graph C based on an optimal clustering solution for driving first level clock cells 706 and another portion of the multiple clock sinks 702A of clock domain A as nodes. Reference label 710 represents second level clock cells (set 3) such as buffers that are inserted in the process (S504) of clustering graph C based on an optimal clustering solution for driving first level clock cells 708 as nodes.

Reference labels 716, 720B, 718B represent clock cells (buffers) that are inserted in the process of constructing clock trees based on the clustered third graphic topology as in the single clock domain. While reference labels 720A, 718A, 714A and 712A represent clock cells (buffers) of clock domain A that are cloned in the process (step S508) of cloning clock cells belonging different clock domains.

In the schematic diagram shown in FIG. 7, clock domain A and clock domain B share 3 levels of physical locations (close in physical locations), as shown by dashed boxes. This thereby may help to reduce clock skew between clock domain A and clock domain B, and improve clock tree and in turn IC chip performance.

A system for constructing clock trees according to an embodiment of the present invention will be described below. For the purpose of concision, the description of the same contents that have been described with reference to FIG. 2 to FIG. 7 may be omitted.

Figure 8:
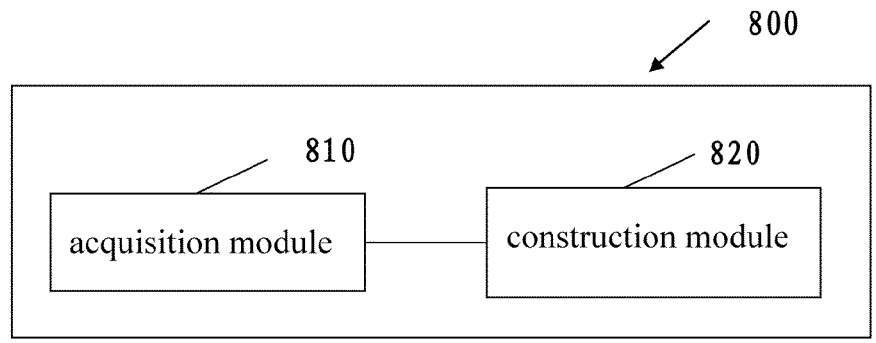
FIG. 8 shows a block diagram of the configuration of a system for clock tree construction according to an embodiment of the present invention.

FIG. 8 shows a block diagram of a system 800 for constructing clock trees according to an embodiment of the present invention. As shown in FIG. 8, the system 800 comprises: an acquisition module 810, configured to acquire a netlist describing an integrated circuit (IC), wherein the netlist comprises data for describing physical locations and logic connections of clock sinks belonging to multiple clock domains on the pattern of the IC. The system 800 further comprises a construction module 820 coupled to the acquisition module 810, configured to construct clock trees across clock domains based on the netlist, to enable clock cells belonging to different clock domains to share more (preferably, as many as possible) physical locations.

Figure 9:
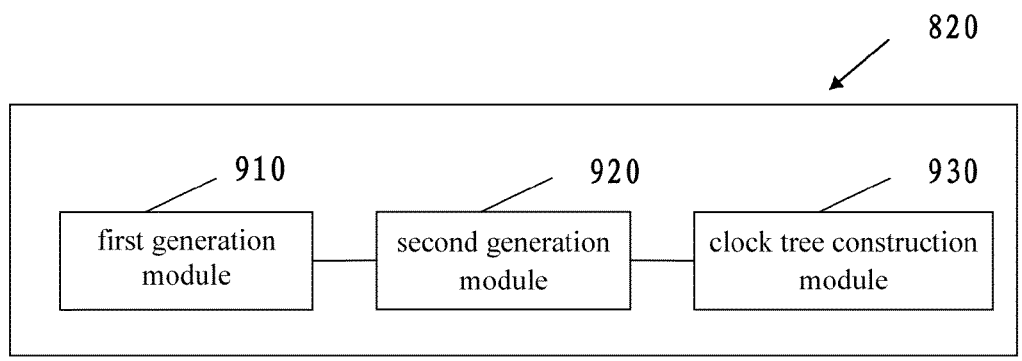
FIG. 9 shows a block diagram of a further configuration of the system for clock tree construction shown in FIG. 8 according to an embodiment of the present invention.

FIG. 9 shows a block diagram of the further configuration of the construction module 820 in the clock tree construction system 800. The construction module 820 may further comprise: a first generation module 910, configured to generate a first clock sink distribution graphic topology of a first clock domain and a second clock sink distribution graphic topology of a second clock domain based on the netlist acquired by the acquisition module 810. The construction module 820 further comprises: a second generation module 920 coupled to the first generation module 910, configured to transform at least one of the first clock sink distribution graphic topology and the second clock sink distribution graphic topology, to generate a merged third graphic topology. Preferably, the second generation module 920 is further configured to, in response to the first clock sink distribution graphic topology and the second clock sink distribution graphic topology that at least partially overlap with each other, perform a process of generating the merged third graphic topology. The construction module 820 further comprises: a clock tree construction module 930 coupled to the second generation module 920, configured to build a clock tree base on the merged third graphic topology such that clock cells belonging different clock domains can share more (preferably, as many as possible) physical locations.

Figure 10:
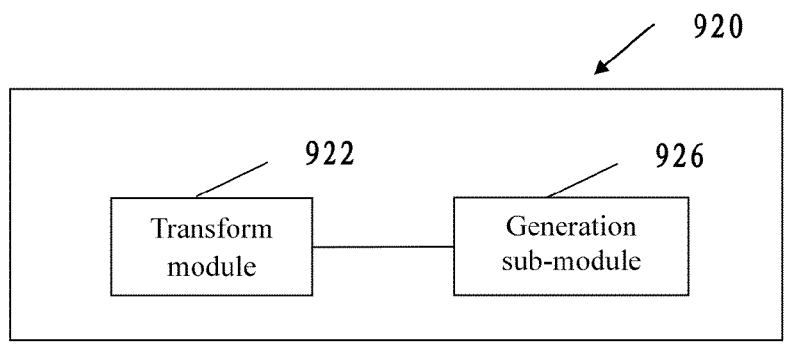
FIG. 10 shows a block diagram of a further configuration of the system for clock tree construction shown in FIG. 9 according to an embodiment of the present invention.

FIG. 10 shows a block diagram of a further configuration of the second generation module 920. As shown in the figure, the generation module 920 may comprise: a transform module 922, configured to insert at least one first level clock cell (such as buffer) in the first clock sink distribution graphic topology and the second clock sink distribution graphic topology to drive multiple clock sinks respectively. The inserted first level clock cell substitutes for the corresponding clock sinks it drives as a node in at least one of the transformed first clock sink distribution graphic topology and the second clock sink distribution graphic topology, to cause at least one of the first clock sink distribution graphic topology and the second clock sink distribution graphic topology to perform at least one of the following two actions: clustering and biasing towards its center, and biasing the first clock sink distribution graphic topology and the second clock sink distribution graphic topology close to each other, to carry out transform until the transformed first clock sink distribution graphic topology and the second clock sink distribution graphic topology have similar bounding areas, while satisfying a center overlap constraint. The second generation module 920 may further comprise a generation sub-module 926 coupled to the transform module 922.

Wherein, the transform module 922 may be configured to select one of the first clock sink distribution graphic topology and the second clock sink distribution graphic topology having a larger bounding area to perform transform. Further, the transform module 922 is configured to assign different priorities for the first clock sink distribution graphic topology and the second clock sink distribution graphic topology according to performance requirements of corresponding clock domains, so that the clock sink distribution graphic topology of the clock domain having a higher priority has a less bias during the transform process.

Figure 11:
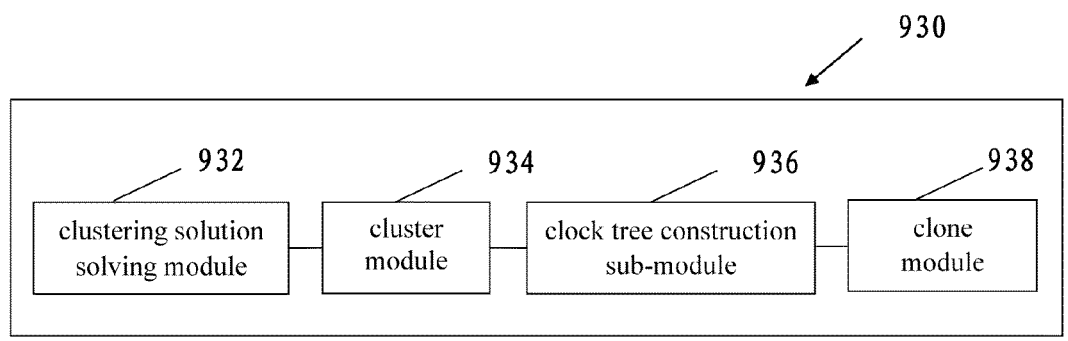
FIG. 11 shows a block diagram of a further configuration of the system for clock tree construction shown in FIG. 9 according to an embodiment of the present invention.

FIG. 11 shows a block diagram of a further configuration of the clock tree construction module 930 according to an embodiment of the present invention shown in FIG. 9. As shown in the figure, the clock tree construction module 930 may comprise: a clustering solution solving module 932, configured to apply predetermined physical and electrical constraints on the merged third graphic topology to solve an optimal clustering solution that indicates nodes having the most communications between clock sinks driven by those nodes respectively should be clustered. The particular process is similar to that described with respect to step S502, which will not be repeated herein. The clock tree construction module 930 may further comprise: a cluster module 934 coupled to the clustering solution solving module 932, configured to cluster the merged third graphic topology through inserting at least one second level clock cell (such as buffer) in the merged third graphic topology to drive two or more respective nodes to be clustered based on the optimal clustering solution. Wherein, the inserted second level clock cell substitutes for the two or more respective nodes to be clustered as a node in the clustered merged third graphic topology. The clock tree construction module 930 may further comprise: a clock tree construction sub-module 936 coupled to the cluster module 934, configured to construct clock trees based on the third graphic topology clustered according to the solved optimal clustering solution in the single clock domain manner. The clock tree construction module 930 may further comprise: a clone module coupled to the clock tree construction sub-module 936, configured to clone clock cells (such as buffers) driving nodes of multiple clock domains in a clock tree, and move the cloned clock cells into the proximity of the original clock cells, so that one clock cell only drive nodes of one corresponding clock domain.

Further, those skilled in the art may understand that system 800 may further comprise a connection module (not shown), configured to connect the inserted and cloned clock cells with wires to finish various clock trees corresponding to different clock domains.

According to an embodiment of the present invention, an IC fabrication method is further provided, in which the method of constructing clock trees of the above embodiment is adopted to construct clock trees of the IC. Further, based on the netlist and the constructed clock trees, subsequent IC design and fabrication processes are carried out by using tools and methods commonly used in the art.

According to an embodiment of the present invention, an IC is further provided, comprising clock trees across clock domains, in which clock cells belonging to different clock domains share more (preferably, as many as possible) physical locations.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for clock tree construction, comprising:
   acquiring, by using a computer, a netlist describing an integrated circuit (IC), wherein the netlist comprises data for describing physical locations and logic connections of clock sinks belonging to multiple clock domains on the pattern of the IC; and,
   constructing, by using a computer, a clock tree across clock domains based on the netlist comprising:
      generating a first clock sink distribution graphic topology of a first clock domain and a second clock sink distribution graphic topology of a second clock domain based on the netlist;
      transforming at least one of the first clock sink distribution graphic topology and the second clock sink distribution graphic topology, to generate a merged third graphic topology; and,
      based on the merged third graphic topology, constructing the clock tree such that clock cells belonging to different clock domains can share more physical locations.

2. The method according to claim 1, wherein,
   the step of generating the merged third graphic topology is performed in response to the first clock sink distribution graphic topology and the second clock sink distribution graphic topology at least partially overlapping with each other; and, in the step of constructing the clock tree based on the merged third graphic topology, the clock tree is constructed such that clock cells belonging to different clock domains can share as many physical locations as possible.

3. The method according to claim 1, wherein the step of generating a merged third graphic topology comprises:
   inserting at least one first level clock cell to drive multiple clock sinks in the first clock sink distribution graphic topology and the second clock sink distribution graphic topology respectively, wherein the inserted first level clock cell substitutes for the corresponding clock sinks it drives as a node in at least one of the transformed first clock sink distribution graphic topology and the second clock sink distribution graphic topology, so as to perform the transforming by causing at least one of the first clock sink distribution graphic topology and the second clock sink distribution graphic topology to execute at least one of the following two actions: clustering and biasing towards a center, and biasing the first clock sink distribution graphic topology and the second clock sink distribution graphic topology close to each other, until the transformed first clock sink distribution graphic topology and the second clock sink distribution graphic topology have similar bounding areas, while satisfying a center overlap constraint; and,
   generating the merged third graphic topology containing the inserted at least one first level clock cell as a node.

4. The method according to claim 3, wherein in the step of generating a merged third graphic topology comprises:

selecting one of the first clock sink distribution graphic topology and the second clock sink distribution graphic topology having a larger bounding area for the transform; and, assigning different priorities for the first clock sink distribution graphic topology and the second clock sink distribution graphic topology according to performance requirements of corresponding clock domains to perform the transform, so that one of the clock sink distribution graphic topologies corresponding to the clock domain having a higher priority is biased less than the other of the clock sink distribution graphic topologies during the transform process.

5. The method according to claim 3, wherein the step of constructing the clock tree based on the merged third graphic topology further comprises:

applying predetermined physical and electrical constraints on the merged third graphic topology to solve an optimal clustering solution that indicates nodes having the most communications between clock sinks driven by those nodes respectively should be clustered together;

clustering the merged third graphic topology through inserting at least one second level clock cell in the merged third graphic topology to drive two or more respective nodes to be clustered based on the optimal clustering solution, wherein the inserted second level clock cell substitutes for the two or more respective nodes to be clustered as a node in the clustered merged third graphic topology;

based on the clustered merged third graphic topology, constructing the clock tree in a manner of the single clock domain; and, cloning a clock cell driving nodes of multiple clock domains in the clock tree, and moving the cloned clock cell into the proximity of the respective original clock cell, so that one clock cell only drive a node of one corresponding clock domain.

6. The method according to claim 5, wherein the inserted and cloned clock cell comprises a buffer.

7. The method according to claim 5, further comprising: connecting the inserted and cloned clock cell with a wire to complete various clock trees corresponding to different clock domains.

8. The method according to claim 5, wherein, the step of solving the optimal clustering solution further comprises: solving the following objective function MaxF to obtain an optimal matrix CL maximizing MaxF, $$\text{Max}F = \left( \sum_{i=1}^{n} \sum_{j=1}^{n} (RM(i,j) * CL(i,j)) \right)$$

$$\begin{cases} CL(i,j) * CL(i,k) - CL(j,i) * CL(j,k) = 0 \\ CL(i,j) = CL(j,i) \\ CL(i,j) \leq DIS(i,j) \\ \sum_{j=1}^{n} (CL(i,j) * PL(j)) \leq PL\text{Max} \\ CL(i,j) \in \{0,1\} \\ CL(i,i) = 1 \\ i,j,k = 1,2,\ldots n \end{cases}$$

wherein, n represents the number of nodes contained in the merged third graphic topology;

i and j represent any two different nodes in the merged third graphic topology;

k represents another node expect for nodes i and j in the merged third graphic topology;

CL represents a matrix to be solved, indicating whether nodes i and j should be clustered in the same cluster, 1 for Yes and 0 for No;

RM represents the number of logical connections between nodes, which equals the total number of logical connections between clock sinks contained in node i and clock sinks contained in node j;

PL represents a constraint on the number of nodes that can be clustered into the same cluster, PLMax is a scalar for preventing an excessive total pin capacitance of a cluster;

DIS represents a constraint on the distance between nodes that can be clustered into the same cluster, DIS (i,j)=1 if it is determined from the distance between nodes i and j that clustering nodes i, j into the same cluster does not violate the net capacitance constraint; otherwise, DIS (i,j)=0.

9. A system for clock tree construction, comprising:

an acquisition module, configured to acquire a netlist describing an integrated circuit (IC), wherein the netlist comprises data for describing physical locations and logic connections of clock sinks belonging to multiple clock domains on the pattern of the IC; and, a construction module, configured to construct a clock tree across clock domains based on the netlist, the construction module comprising:

a first generation module, configured to generate a first clock sink distribution graphic topology of a first clock domain and a second clock sink distribution graphic topology of a second clock domain based on the netlist;

a second generation module, configured to generate the merged third graphic topology through transforming at least one of the first clock sink distribution graphic topology and the second clock sink distribution graphic topology; and, a clock tree construction module, configured to construct clock trees based on the merged third graphic topology such that clock cells belonging to different clock domains can share more physical locations.

10. The system according to claim 9, wherein, the second generation module is further configured to perform the process of generating the merged third graphic topology in response to the first clock sink distribution graphic topology and the second clock sink distribution graphic topology at least partially overlapping with each other; and, the clock tree construction module is further configured to construct the clock tree such that clock cells belonging different clock domains can share as many physical locations as possible.

11. The system according to claim 9, wherein the second generation module further comprises:

a transform module, configured to insert at least one first level clock cell to drive multiple clock sinks respectively in the first clock sink distribution graphic topology and the second clock sink distribution graphic topology, wherein the inserted first level clock cell substitutes for the corresponding clock sinks it drives as a node in at least one of the transformed first clock sink distribution graphic topology and the second clock sink distribution graphic topology, so as to perform the transforming by causing at least one of the first clock sink distribution graphic topology and the second clock sink distribution graphic topology to execute at least one of the following two actions: clustering and biasing towards a center, and biasing the first clock sink distribution graphic topology and the second clock sink distribution graphic topology close to each other, until the transformed first clock sink distribution graphic topology and the second clock sink distribution graphic topology have similar bounding areas, while satisfying a center overlap constraint; and,
a generation sub-module, configured to generate the merged third graphic topology containing the inserted at least one first level clock cell as a node.

12. The system according to claim 11, wherein the transform module is configured to:
select one of the first clock sink distribution graphic topology and the second clock sink distribution graphic topology having a larger bounding area to perform transform; and,
assign different priorities for the first clock sink distribution graphic topology and the second clock sink distribution graphic topology according to performance requirements of corresponding clock domains to perform the transform, so that one of the clock sink distribution graphic topologies corresponding to the clock domain having a higher priority is biased less than the other of the clock sink distribution graphic topologies during the transform process.

13. The system according to claim 11, wherein the clock tree construction module further comprises:
a clustering solution solving module, configured to apply predetermined physical and electrical constraints on the merged third graphic topology to solve an optimal clustering solution that indicates nodes having the most communications between clock sinks driven by those nodes respectively should be clustered together;
a cluster module, configured to cluster the merged third graphic topology through inserting at least one second level clock cell in the merged third graphic topology to drive two or more respective nodes to be clustered based on the optimal clustering solution, wherein, the inserted second level clock cell substitutes for the two or more respective nodes to be clustered as a node in the clustered merged third graphic topology;
a clock tree construction sub-module, configured to based on the clustered merged third graphic topology, construct the clock tree in a manner of the single clock domain, and a clone module, configured to clone a clock cell driving nodes of multiple clock domains in the clock tree, and moving the cloned clock cell into the proximity of the respective original clock cell, so that one clock cell only drive a node of one corresponding clock domain.

14. The system according to claim 13, wherein the inserted and cloned clock cell comprises a buffer.

15. The system according to claim 13, further comprising:
a connection module, configured to connect the inserted and cloned clock cell with a wire to complete various clock trees corresponding to different clock domains.

16. The system according to claim 13, wherein the clustering solution solving module is further configured to solve the following objective function MaxF to obtain an optimal matrix CL maximizing MaxF, $$\mathrm{Max}F = \left( \sum_{i=1}^{n} \sum_{j=1}^{n} (RM(i,j) * CL(i,j)) \right)$$

$$\begin{cases} CL(i,j) * CL(i,k) - CL(j,i) * CL(j,k) = 0 \\ CL(i,j) = CL(j,i) \\ CL(i,j) \le DIS(i,j) \\ \sum_{j=1}^{n} (CL(i,j) * PL(j)) \le PL\mathrm{Max} \\ CL(i,j) \in \{0,1\} \\ CL(i,i) = 1 \\ i,j,k = 1,2,\ldots n \end{cases}$$

wherein,
n represents the number of nodes contained in the merged third graphic topology;
i and j represent any two different nodes in the merged third graphic topology, k represents another node expect for nodes i and j in the merged third graphic topology; CL represents a matrix to be solved, indicating whether nodes i and j should be clustered in the same cluster, 1 for Yes and 0 for No;
RM represents the number of logical connections between nodes, which equals the total number of logical connections between clock sinks contained in node i and clock sinks contained in node j;
PL represents a constraint on the number of nodes that can be clustered into the same cluster,
PLMax is a scalar for preventing an excessive total pin capacitance of a cluster;
DIS represents a constraint on the distance between nodes that can be clustered into the same cluster, DIS (i,j)=1 if it is determined from the distance between nodes i and j that clustering nodes i, j into the same cluster does not violate the net capacitance constraint; otherwise, DIS (i,j)=0.

17. An IC fabrication method, comprising constructing a clock tree of the IC by using the clock tree construction method of claim 1.

* * * * *